(12) United States Patent
Matsumoto

(10) Patent No.: US 11,452,248 B2
(45) Date of Patent: Sep. 20, 2022

(54) WORK MACHINE

(71) Applicant: FUJI CORPORATION, Chiryu (JP)

(72) Inventor: Toru Matsumoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 592 days.

(21) Appl. No.: 16/483,058

(22) PCT Filed: Feb. 8, 2017

(86) PCT No.: PCT/JP2017/004498
§ 371 (c)(1),
(2) Date: Aug. 2, 2019

(87) PCT Pub. No.: WO2018/146740
PCT Pub. Date: Aug. 16, 2018

(65) Prior Publication Data
US 2020/0233395 A1 Jul. 23, 2020

(51) Int. Cl.
H05K 13/02 (2006.01)
H05K 13/04 (2006.01)
(Continued)

(52) U.S. Cl.
CPC .......... H05K 13/022 (2013.01); B25J 9/1676 (2013.01); B25J 15/06 (2013.01);
(Continued)

(58) Field of Classification Search
CPC ............. H05K 13/0413; H05K 13/022; H05K 13/0853; G05B 19/4061;
(Continued)

(56) References Cited

U.S. PATENT DOCUMENTS

2002/0169522 A1* 11/2002 Kanno ............... G05B 19/4061
700/245
2014/0052297 A1* 2/2014 Mattern ................. B25J 9/1015
700/259
(Continued)

FOREIGN PATENT DOCUMENTS

EP 3 057 392 A1 8/2016
JP 2-47045 3/1990
(Continued)

OTHER PUBLICATIONS

International Search Report dated Apr. 25, 2017 in PCT/JP2017/004498 filed on Feb. 8, 2017.

Primary Examiner — Livius R. Cazan
(74) Attorney, Agent, or Firm — Oblon, McClelland, Maier & Neustadt, L.L.P.

(57) ABSTRACT

A work machine including a work head including a holding tool to pick up and hold a component, a rotating device to rotate the holding tool about an axis of the holding tool, a pivoting device to pivot the holding tool between a first attitude in which a distal end portion of the holding tool faces downward and a second attitude in which the distal end portion of the holding tool faces sideways; a moving device to move the work head; and a control device to control operation of the work head and the moving device, the control device including an operation control section to cause the holding tool to pivot from the first attitude to the second attitude, and to cause the holding tool to rotate from a holding angle that is a rotation angle when the component was picked up to a target angle.

1 Claim, 12 Drawing Sheets

(51) Int. Cl.
*B25J 15/06* (2006.01)
*G05B 19/4061* (2006.01)
*H05K 13/08* (2006.01)
*B25J 9/16* (2006.01)

(52) U.S. Cl.
CPC ...... *B25J 15/0616* (2013.01); *G05B 19/4061* (2013.01); *H05K 13/0409* (2018.08); *H05K 13/0413* (2013.01); *H05K 13/0812* (2018.08); *H05K 13/0853* (2018.08); *G05B 2219/39466* (2013.01); *G05B 2219/45026* (2013.01)

(58) Field of Classification Search
CPC ............ G05B 2219/39466; B25J 15/06; B25J 15/0616; B25J 9/1676
See application file for complete search history.

(56) References Cited

U.S. PATENT DOCUMENTS

2015/0328776 A1   11/2015   Shiratsuchi
2017/0196131 A1*   7/2017   Ishikawa ................ H05K 13/08

FOREIGN PATENT DOCUMENTS

| JP | 6-270088 A | 9/1994 | |
|---|---|---|---|
| JP | 2002-331480 A | 11/2002 | |
| JP | 2011-56646 A | 3/2011 | |
| WO | WO-2004052596 A1 * | 6/2004 | ............ B25J 9/1676 |
| WO | WO-2015186188 A1 * | 12/2015 | ........... H05K 13/022 |
| WO | WO 2016/046897 A1 | 3/2016 | |

* cited by examiner

WORK MACHINE

TECHNICAL FIELD

The present application relates to a work machine provided with a work head having a holding tool configured to hold a component, and a moving device configured to move the work head.

BACKGROUND ART

In the field of work machines, as described in the following patent literature, it is known to perform work by picking up and holding scattered components. Among such work machines, a work machine for picking up and holding a component includes a rotating device configured to rotate a holding tool around an axis, and a pivoting device configured to pivot the holding tool between a position in which a tip portion of the holding tool faces downward and a position in which the tip portion of the holding tool faces sideways.

CITATION LIST

Patent Literature

Patent literature 1: JP-A-2002-331480

SUMMARY

Technical Problem

In a working head that includes a rotating device and a pivoting device, since the holding tool changes to various attitudes, there is a worry that a component held by the holding tool will contact a portion of the work machine. The present disclosure has been made in view of such circumstances, and it is an object of the present disclosure to avoid contact of a portion of a work machine by a component held by a holding tool.

Solution to Problem

To solve the above problems, a work machine of the present disclosure includes: a work head including a holding tool configured to pick up and hold a component, a rotating device configured to rotate the holding tool about an axis of the holding tool, a pivoting device configured to pivot the holding tool between a first attitude in which a distal end portion of the holding tool faces downward and a second attitude in which the distal end portion of the holding tool faces sideways; a moving device configured to move the work head; and a control device configured to control operation of the work head and the moving device, the control device including an operation control section configured to, when the working head has moved to a target position after the component has been picked up by the holding tool in the first attitude, cause the holding tool to pivot from the first attitude to the second attitude, and to cause the holding tool to rotate from a holding angle that is a rotation angle when the component was picked up to a target angle, wherein the operation control device is configured to, along with causing the holding tool to pivot from the first attitude to the second attitude, when rotating the holding tool from the holding angle to the target angle, in a case in which the component held by the holding tool will contact a portion of the work machine, perform control of operation of at least one of the rotating device or the pivoting device such that the component held by the holding tool avoids contacting a portion of the work machine.

Advantageous Effects

According to the present disclosure, by controlling the operation of at least one of the rotating device and the pivoting device, it is possible to avoid a component held by the holding tool contacting a portion of the work machine.

DESCRIPTION OF EMBODIMENTS

The following describes in detail referring to the figures an example embodiment of the present disclosure.

(A) Configuration of Component Mounter

Figure 1:
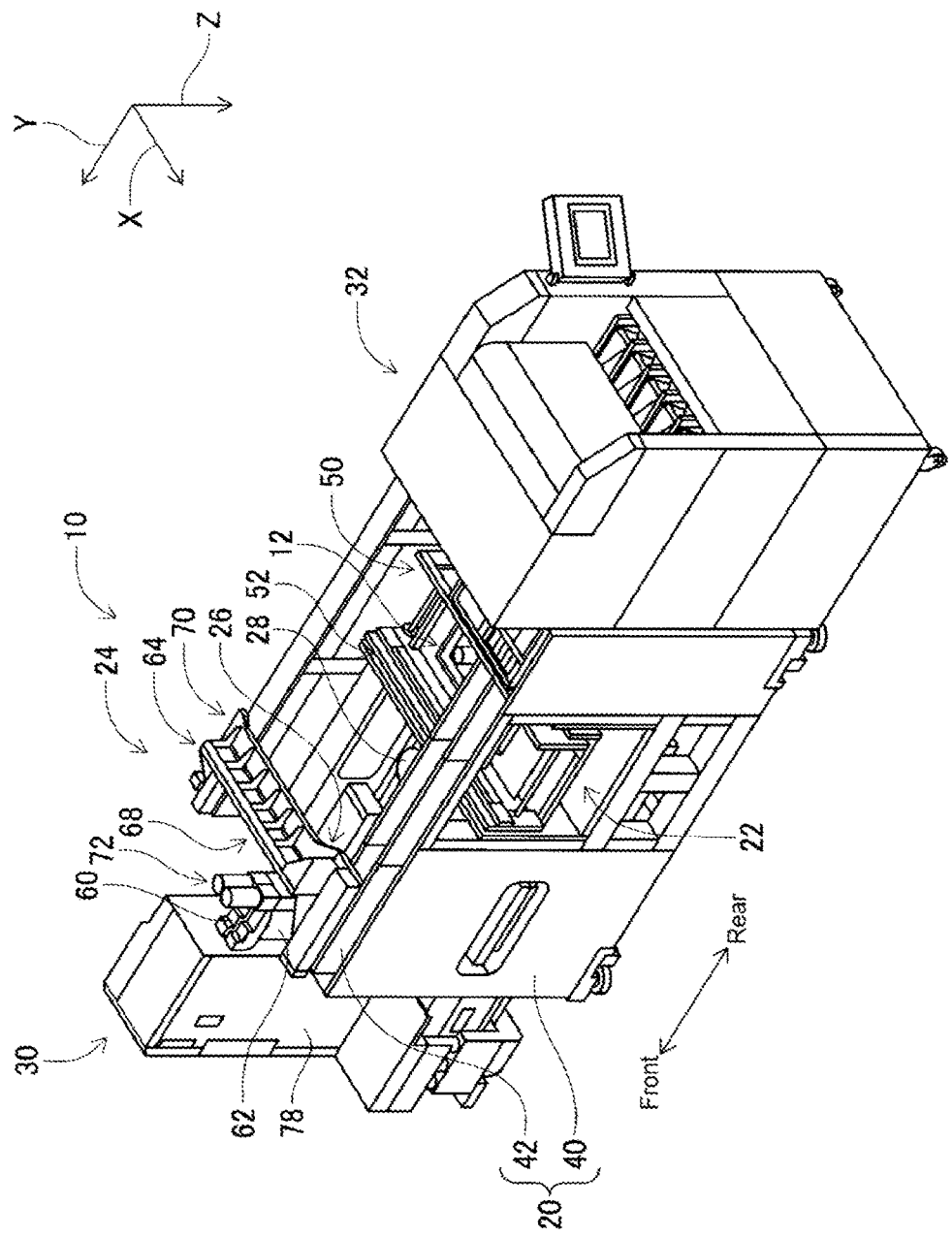
FIG. 1 is a perspective view of a component mounter.

FIG. 1 shows component mounter 10. Component mounter 10 performs work of mounting components on circuit board 12. Component mounter 10 includes device main body 20, board conveying and holding device 22, component mounting device 24, imaging devices 26 and 28, component feeders 30, loose component feeder 32, and control device 34 (see FIG. 9). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
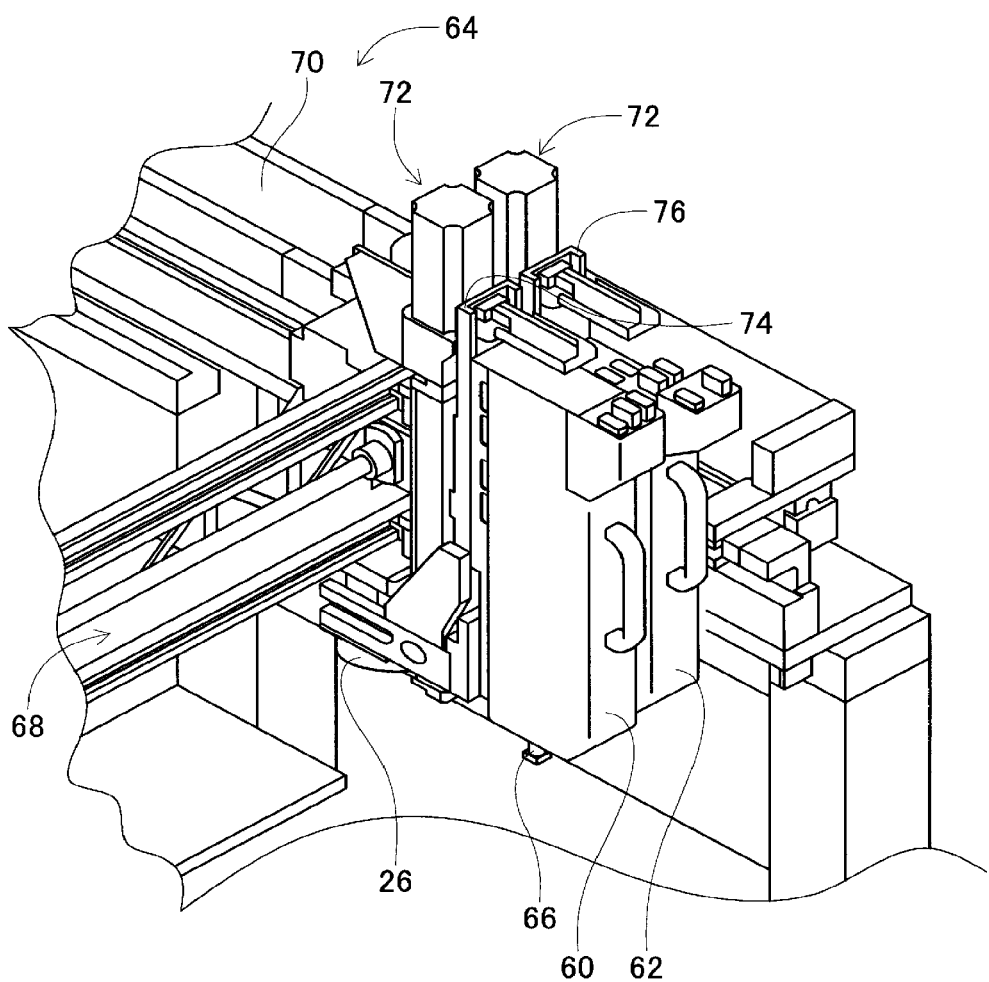
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
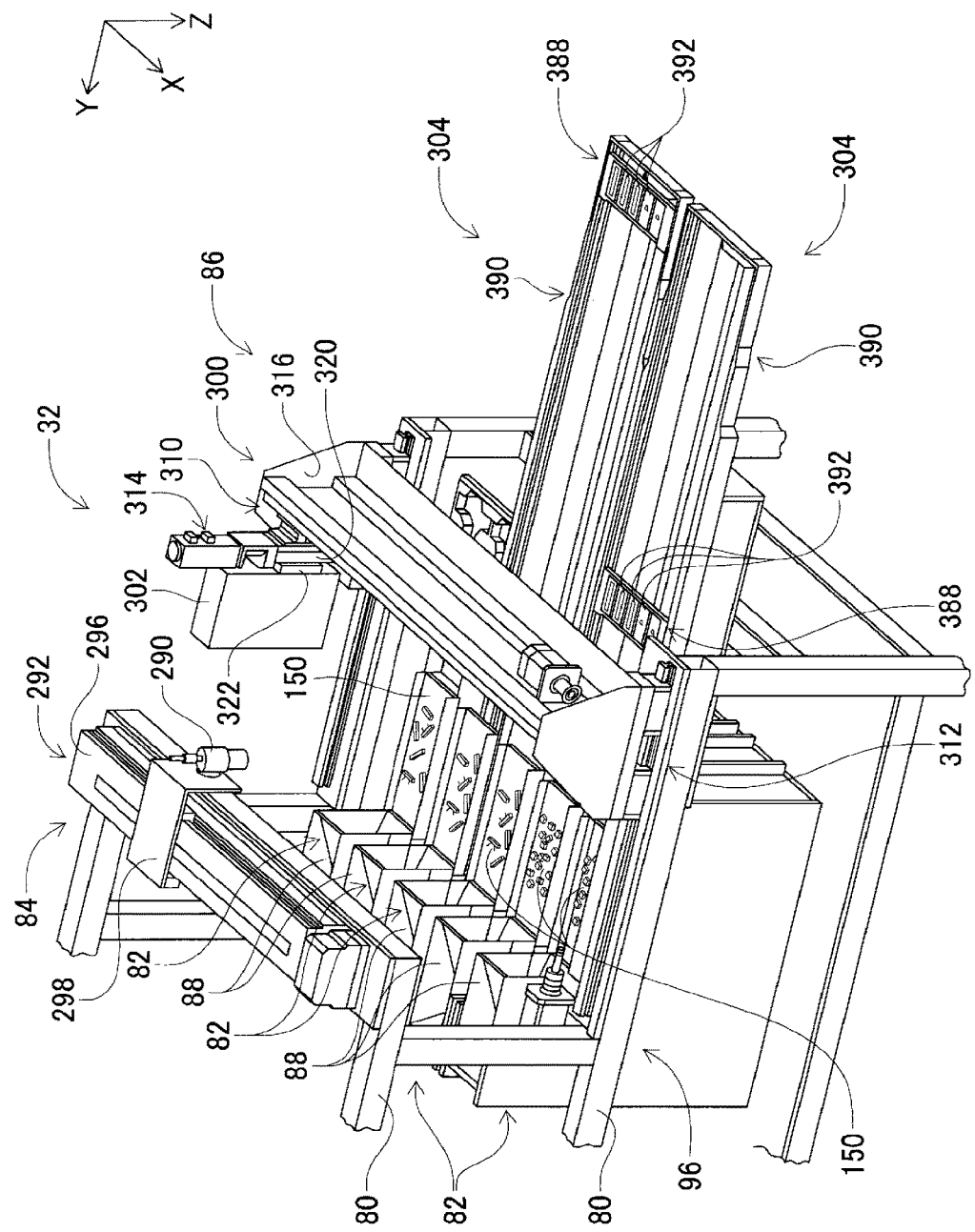
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88 and component scattering device 90 (see FIG. 4), which are integrally configured. Component supply unit 82 is assembled to be removable from base 96 of main body 80, and with loose component supply device 32, five component supply units 82 are arranged in one row in the X direction.

Figure 4:
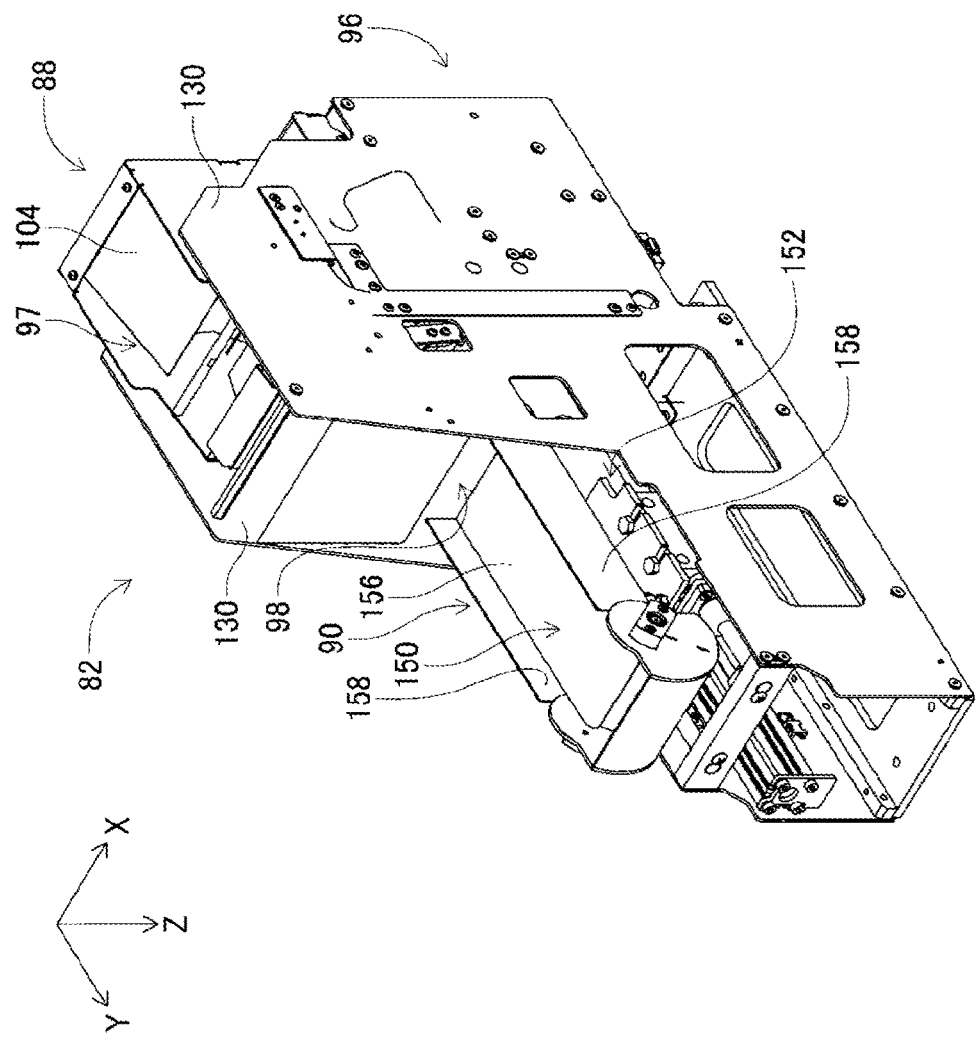
FIG. 4 is a perspective view of a component supply unit.
Figure 5:
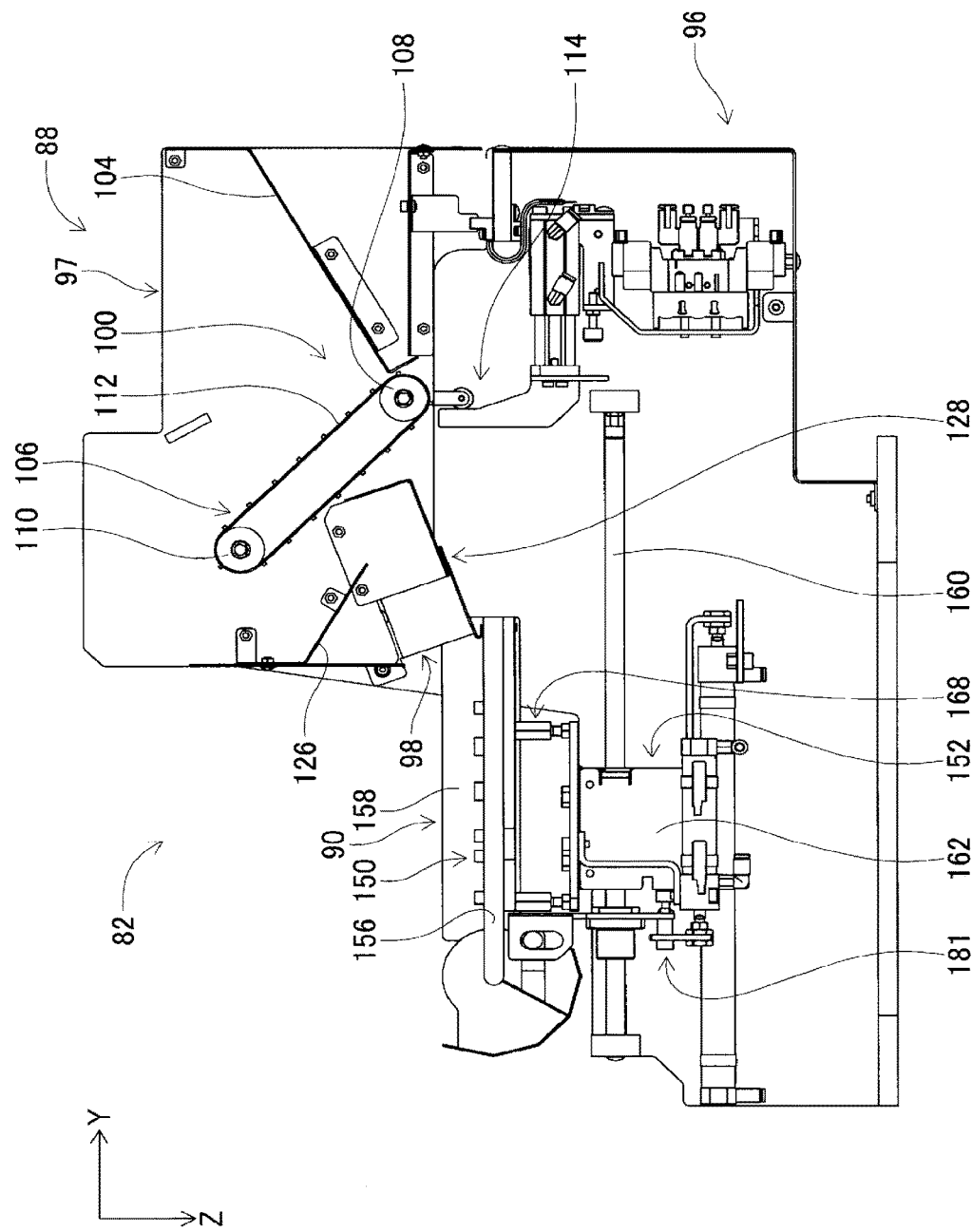
FIG. 5 is a cross section view of the component supply unit.

As shown in FIGS. 4 and 5, component supply apparatus 88 is a substantially cuboid box arranged to extend in the Y direction. The Y direction is the front-rear direction of component supply apparatus 88 with the left side in FIG. 5 sometimes referred to as the front and the right side in FIG. 5 sometimes referred to as the rear. That is, in component supply unit 82, the side towards the end at which component scattering device 90 is arranged is sometimes referred to as the front, and the side towards the end at which component supply apparatus 88 is arranged is sometimes referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Roller 108 faces the front end of inclined plate 104, that is, the lowest end of inclined plate 104, with a clearance gap between them. Roller 110 is arranged diagonally above and to the front of roller 108. Conveyor belt 112 is stretched over the pair of rollers 108 and 110.

Also, the pair of rollers 108 and 110 are rotatable around their center axis, with rotation being controlled by operation of rotation device 114. The rotation direction of rollers 108 and 110 is the counterclockwise direction in FIG. 5. Thus, conveyor belt 112 revolves around rollers 108 and 110 in a counterclockwise direction in FIG. 5. In other words, the conveyance direction of conveyor belt 112 is diagonally up from the front end of inclined plate 104.

Also, inclined plate 126 is arranged diagonally below and in front of roller 110 of conveyor device 106. Inclined plate 126 is arranged across the entire width of component supply apparatus 88 and is inclined from the front end surface of component supply apparatus 88 to below roller 110 such that the rear end of inclined plate 126 is positioned lower than the front end. Further, inclined plate 128 is arranged below inclined plate 126. Inclined plate 128 is arranged across the entire width of component supply apparatus 88 and is inclined from below a central portion of conveyor device 106 towards discharge opening 98 of component supply apparatus 88 such that the front end of inclined plate 128 is positioned lower than the rear end.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

Further, component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 so as to be slid to any position by operation of electromagnetic motor 166 (refer to FIG. 9). Stage 156 of component support member 150 is connected to slider 162 via connection mechanism 168. Thus, component support member 150 moves in the Y direction by operation of component support member moving device 152, so as to move to and from a stored state (refer to FIG. 6) stored below component supply apparatus 88 and an exposed state (refer to FIG. 5) drawn out from below component supply apparatus 88.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 9). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 extending in the X direction, and Y slider 316 is moved to any position in the Y direction by operation of electromagnetic motor 319 (refer to FIG. 9). X-direction moving device 310 includes X slider 320 provided on a side surface of Y slider 316, and X slider 320 is moved to any position in the X direction by operation of electromagnetic motor 321 (refer to FIG. 9). Z-direction moving device 314 includes Z slider 322 provided on a side surface of X slider 320, and Z slider 322 is moved to any position in the Z direction by operation of electromagnetic motor 323 (refer to FIG. 9).

Figure 7:
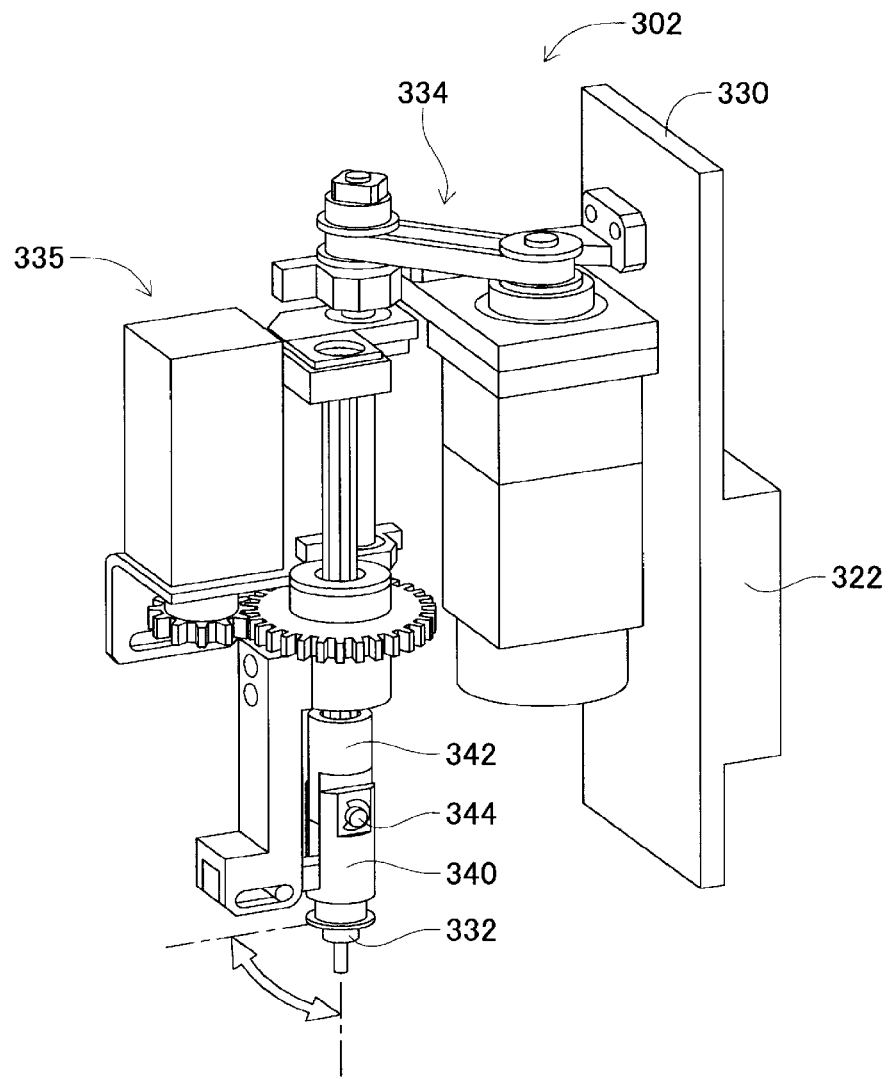
FIG. 7 is a perspective view of a component holding head.

As shown in FIG. 7, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is swingably held by support shaft 344 at the lower end portion of the holder support section 342, and holder 340 is bent upward by 90 degrees by operation of nozzle pivoting device 334. By this, suction nozzle 332 attached to the bottom end of holder 340 is pivoted 90 degrees to be positioned at the pivoted position. That is, suction nozzle 332 changes to and from an attitude in which the tip of suction nozzle 332 is oriented downward and an attitude in which the tip of suction nozzle 332 is oriented sideways due to operation of nozzle pivoting device 334, so as to switch between a non-pivoted position and a pivoted position. Further, nozzle rotating device 335 rotates holder support section 342 around its own axis. As a result, suction nozzle 332 rotates around its own axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 8:
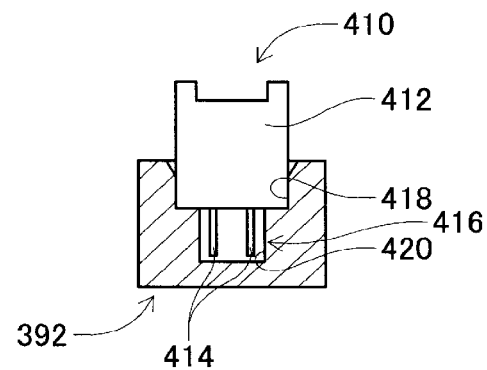
FIG. 8 shows a component receiving member in which is stored a leaded component.

In detail, as shown in FIG. 8, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392 in accordance with the shape of leaded component 410. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 9). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 9:
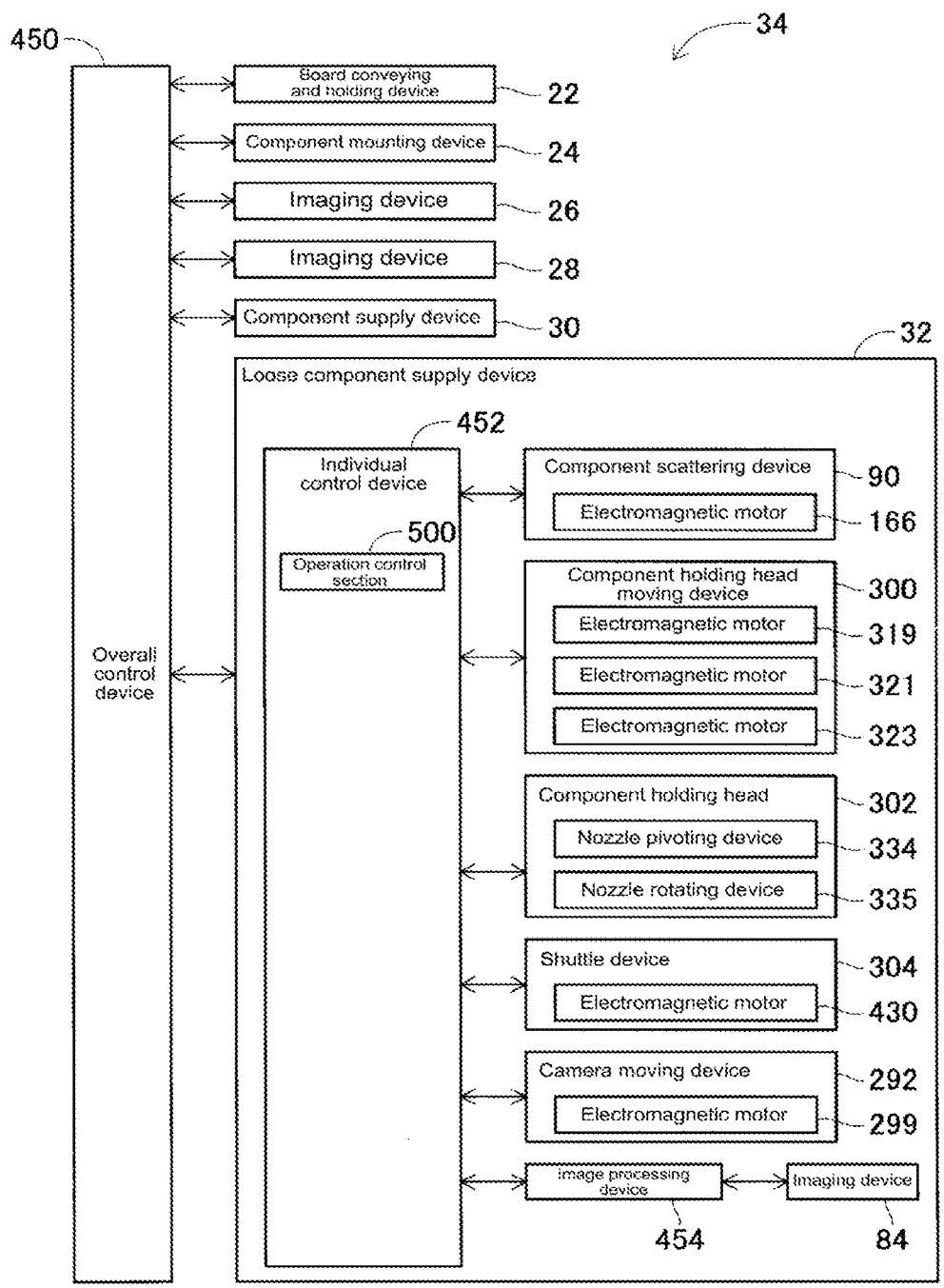
FIG. 9 is a block diagram showing a control device of the component mounter.

Further, as shown in FIG. 9, control device 34 includes overall control device 450, multiple individual control devices (only one is shown in the figure) 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, camera moving device 292, component holding head moving device 300, component holding head 302, and shuttle device 304. Individual control device 452 of loose component supply device 32 controls component scattering device 90, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84.

(B) Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

(C) Operation of Loose Component Supply Device

With loose component supply device 32, leaded components 410 are inserted by an operator into insertion opening 97 of component supply apparatus 88, then, the inserted leaded components 410 are supplied in a state loaded on component receiving member 392 of component carrier 388 by operation of component supply unit 82 and component transfer device 86. In detail, the operator inserts leaded components 410 via insertion opening 97 at the top of component supply apparatus 88. Here, component support member 150 is moved below component supply apparatus 88 by operation of component support member moving device 152 to be in a stored state (refer to FIG. 6).

Figure 6:
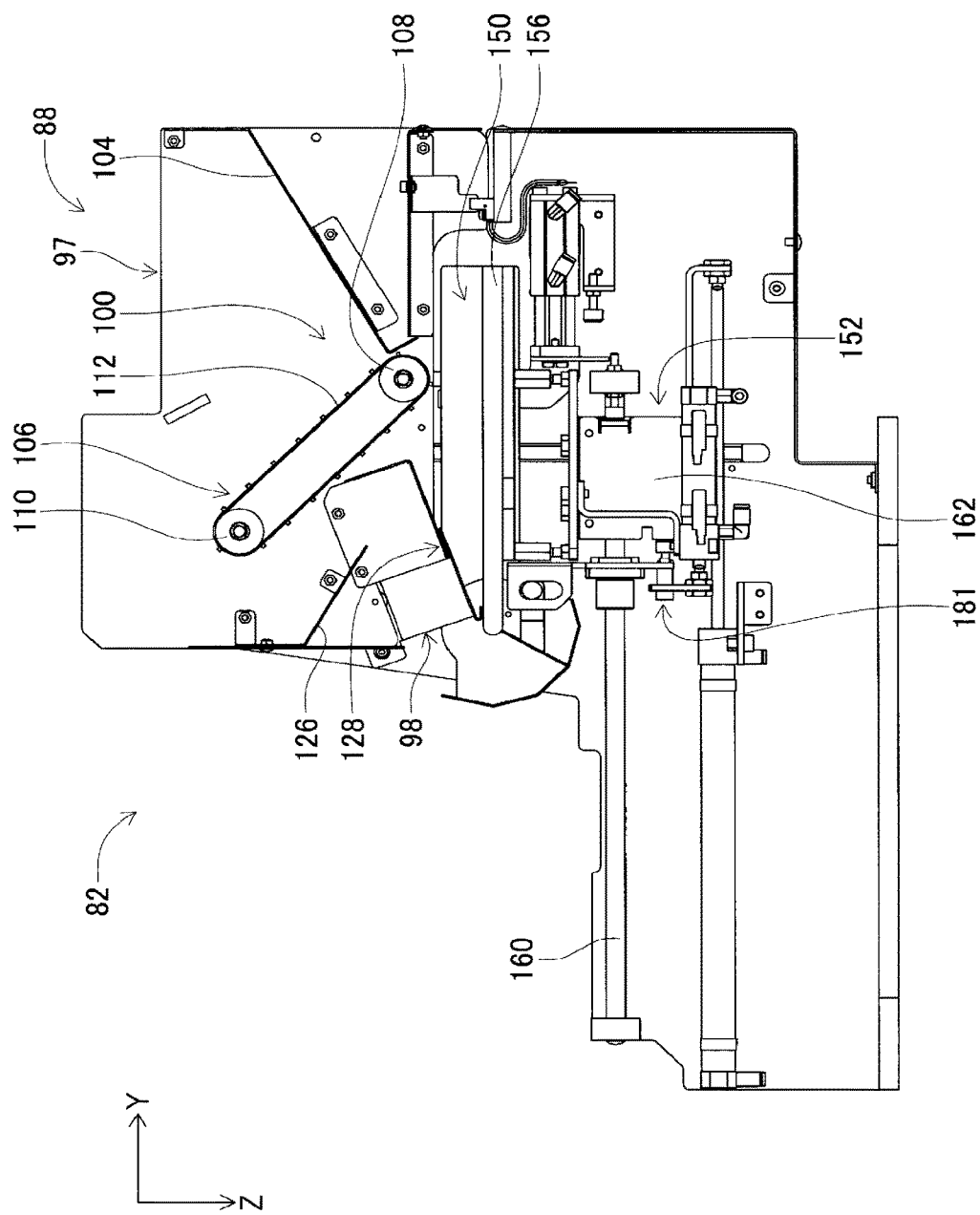
FIG. 6 is a cross section view of the component supply unit.

Leaded components 410 inserted via insertion opening 97 on the top surface of component supply apparatus 88 fall onto inclined plate 104 of component supply apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. Then, when rotation device 116 of conveyor device 106 is operated, conveyor belt 112 of conveyor device 106 is rotated counterclockwise as shown in FIG. 6. By this, leaded components 410 piled up in housing section 100 are conveyed by conveyor belt 112 diagonally up and forward.

Then, leaded components 410 conveyed upward diagonally by conveyor belt 112 drop from the upper end of conveyor belt 112 onto inclined plate 126. Leaded components 410 that have fallen onto inclined plate 126 roll towards the rear of inclined plate 126 onto inclined plate 128 provided below inclined plate 126. Then, leaded components 410 that have fallen onto inclined plate 128 roll towards the front and are discharged from discharge opening 98 at the front of component supply apparatus 88.

Component support member 150 is moved towards the front from under component supply apparatus 88 due to operation of component supply member moving device 152 at the time that leaded components 410 are discharged from discharge opening 98 of component supply apparatus 88. By this, leaded components 410 discharged from discharge opening 98 of component supply apparatus 88 are discharged onto the upper surface of stage 156 of component support member 150.

Then, component support member 150 is moved forwards from the stored state to the exposed state and then movement of component support member 150 is stopped. By this, leaded components 410 are scattered across the entire upper surface of stage 156. With component supply apparatus 88, operation of conveyor device 106 is stopped to match the timing of the stopping of the operation of component support member 150 such that leaded components 410 are discharged finally from component supply apparatus 88.

According to the above procedure, when leaded components 410 are scattered from component supply apparatus onto stage 156 of component support member 150, camera 290 of imaging device 84, by operation of camera moving device 292, moves above component support member 150 and images leaded components 410. Then, information such as the position of the leaded component 410 on component support member 150, the posture of leaded component 410, and the like is acquired based on the imaging data.

Figure 10:
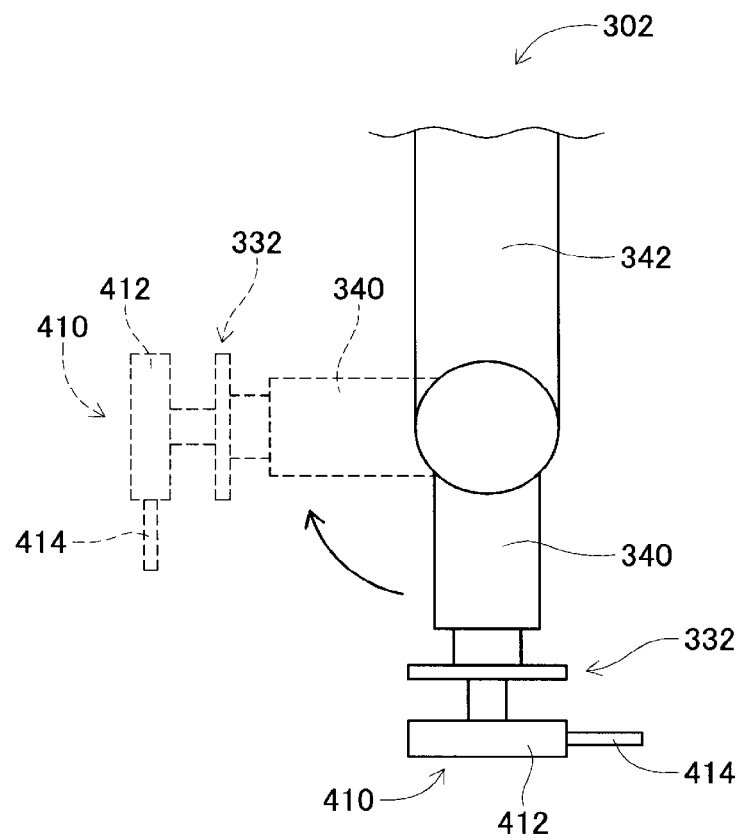
FIG. 10 is an enlarged view of a component holding head when holding a leaded component part.

Next, based on the acquired positional information of the leaded component 410, by operation of component holding head moving device 300, component holding head 302 is moved above the leaded component 410 to be held. At this time, suction nozzle 332 is oriented downward by the nozzle pivoting device 334, and is positioned in the non-pivoted position. Suction nozzle 332 is rotated based on the posture of the leaded component 410 to be held. In detail, as shown in FIG. 10, holder supporting section 342 to which the suction nozzle 332 is mounted is rotated by nozzle rotating device 335 so that the direction in which leads 414 of the leaded component 410 to be held extend is opposite to the direction in which holder 340 of component holding head 302 pivots. Note that, the rotation angle here due to the nozzle rotating device is also referred to as the holding angle.

Then, component holding head 302 is lowered, and the leaded component 410 to be held is picked up and held by the suction nozzle 332. Subsequently, component holding head 302 is moved by component holding head moving device 300 to the position above component carrier 388 as the target position. Here, component carrier 388 is moved to the component receiving position by operation of component carrier moving device 390. Also, when component holding head 302 is moved above component carrier 388, suction nozzle 332 is pivoted to the pivoted position by nozzle pivoting device 334. As a result, as shown in FIG. 10, the suction nozzle 332 positioned at the pivoted position assumes an attitude in which the tip is pointing sideways, and leads 414 of leaded component 410 held by suction nozzle 332 face downward in the vertical direction.

Also, when component holding head 302 moves above component carrier 388, holder supporting section 342 to which the suction nozzle 332 is attached is rotated so that the leaded component 410 held by the suction nozzle 332 can be inserted into component reception recess 416 of component reception member 392 in component carrier 388. More specifically, component reception recess 416 has a shape corresponding to the leaded component 410, and the leaded component 410 cannot be inserted into component reception recess 416 unless the leaded component 410 held by the suction nozzle 332 is in a posture corresponding to the opening of the component reception recess 416. Therefore, for example, it is necessary to change the orientation of the leaded component 410 such that the width direction of the leaded component 410 held by suction nozzle 332 matches the width direction of the opening of component reception recess 416.

Figure 11:
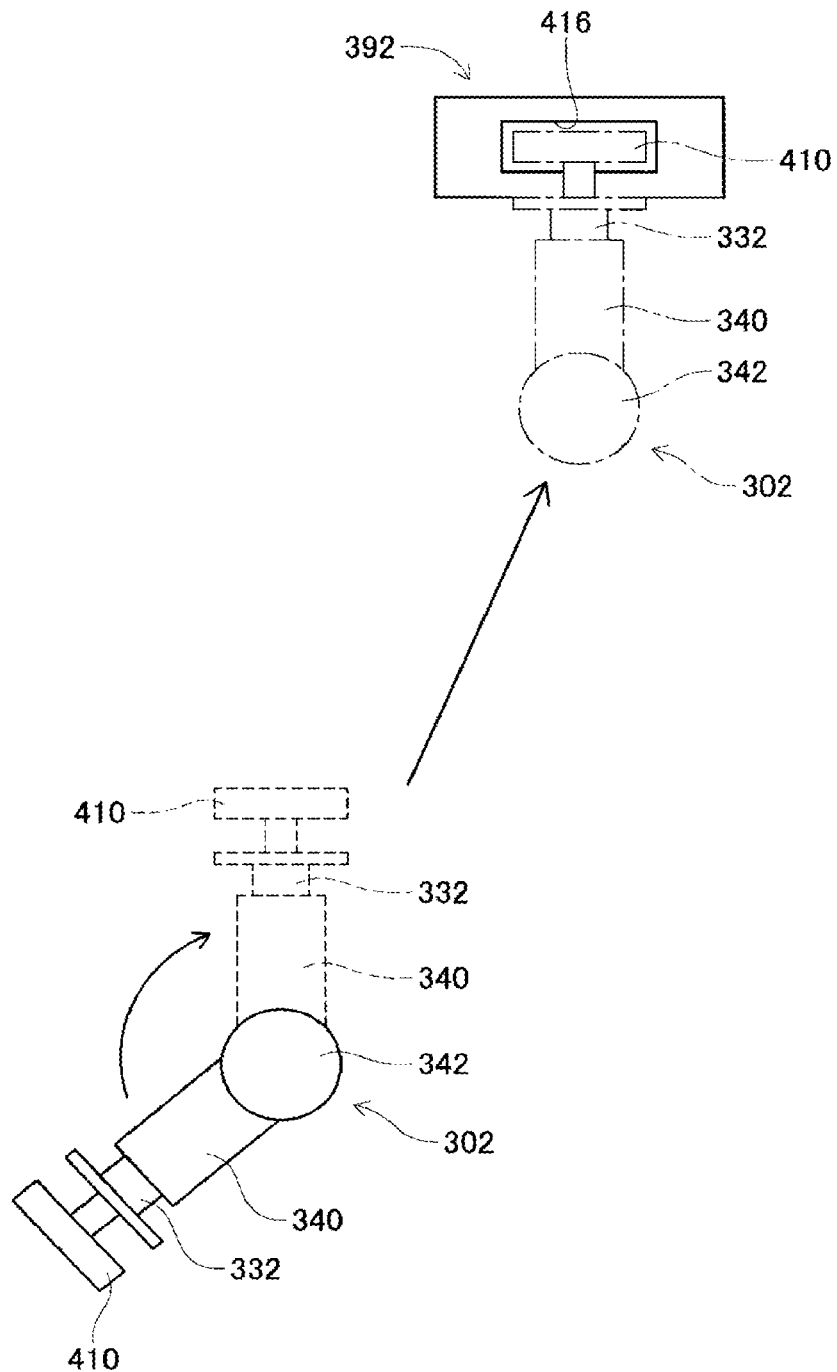
FIG. 11 is a schematic diagram showing the operating state of the component holding head when the component is not liable to contact the sidewall.

Thus, as shown in FIG. 11, the holder supporting section 342 on which the suction nozzle 332 is mounted is rotated (the component holding head 302 indicated by a dash-dot line) so that the width direction of the leaded component 410 held by the suction nozzle 332 coincides with the width direction of the opening of the component reception recess 416. As a result, the leaded component 410 held by the suction nozzle 332 can be inserted into the component reception recess 416. Note that, when the rotation angle of the suction nozzle 332 capable of inserting the leaded component 410 into the component reception recess 416, that is, the rotation angle of holder support portion 342, is also referred to as a target angle.

That is, when component holding head 302 moves above component carrier 388, the holder supporting section 342 to which the suction nozzle 332 is attached is rotated by nozzle rotating device 335 from the holding angle (the component holding head 302 indicated by the solid line) to the target angle (the component holding head 302 indicated by the dotted line). Note that, the rotation direction is a direction in which the rotation angle from the holding angle to the target angle decreases. That is, in the case shown in FIG. 11, the rotation direction is a clockwise direction. This shortens the time required for rotation of suction nozzle 332.

In this manner, when component holding head 302 moves above component carrier 388 after the leaded component 410 is picked up by the suction nozzle 332, the suction nozzle 332 is pivoted from the non-pivoted position to the pivoted position, and is rotated from the holding angle to the target angle. Note that, the timing of starting the pivoting and the timing of starting the rotating of suction nozzle 332 are the same as the timing of starting the moving of component holding head 302. That is, the operation of each of nozzle pivoting device 334 and nozzle rotating device 335 is started at the same timing as the timing of starting the moving of component holding head 302 by component holding head moving device 300. This makes it possible to make maximum use of the moving time of the component holding head 302 to perform pivoting and rotation of suction nozzle 332.

Further, when component holding head 302 moves above component carrier 388, the leaded component 410 held by the suction nozzle 332 is positioned such that leads 414 face downward in the vertical direction and assumes a posture corresponding to the opening of component reception recess 416. As a result, by component holding head 302 being lowered and suction nozzle 332 releasing the leaded component 410, the leaded component 410 is loaded on component receiving member 392.

When leaded component 410 is loaded on component receiving member 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite to the bottom surface to which leads 414 are connected facing upwards. Therefore, suction nozzle 66 of work head 60 or 62 is able to appropriately hold leaded component 410.

In this manner, with loose component supply device 32, when component holding head 302 moves above component carrier 388 after the leaded component 410 is picked up by suction nozzle 332, the suction nozzle 332 is pivoted and rotated. As a result, leaded component 410 held by suction nozzle 332 is loaded in component reception recess 416 of component receiving member 392 such that the leaded component 410 is appropriately supplied. However, as suction nozzle 332 pivots and rotates, there is a worry that the leaded component 410 held by the suction nozzle 332 may contact a portion of loose component supplying device 32.

Specifically, as shown in FIG. 3, five component supply units 82 are arranged in a line in the X direction inside loose component supply device 32, and although omitted in FIG. 3, the inside of loose component supply device 32 is covered with a housing. For this reason, the component supply units 82 disposed at both ends of the five component supply units 82 in the X direction is adjacent to side wall 470 (see FIG. 12) of the housing. With a component supply unit 82 adjacent to side wall 470, when the leaded component 410 is picked by the suction nozzle 332 from component support member 150 and moved to above component receiving member 392, there is a possibility that the leaded component 410 held by the suction nozzle 332 will contact side wall 470.

Figure 12:
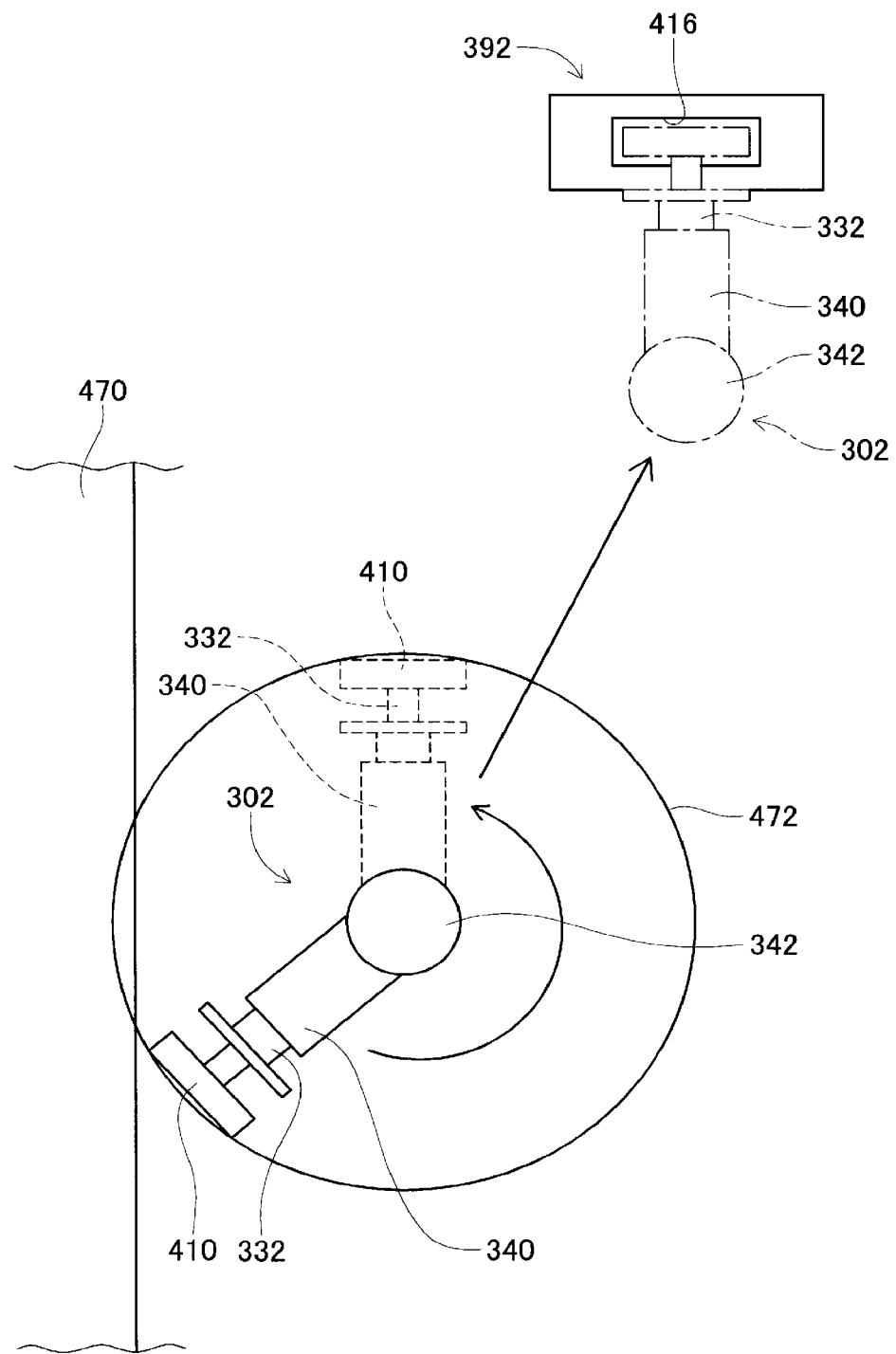
FIG. 12 is a schematic diagram showing the operating state of the component holding head when the component is liable to come into contact with the sidewall.

In detail, when a leaded component 410 is scattered on the upper surface of component support member 150 at a position close to side wall 470, component holding head 302 moves to a position relatively close to side wall 470, as shown in FIG. 12. Then, the leaded component 410 scattered on component support member 150 is picked up by suction nozzle 332. When the leaded component 410 is picked up by the suction nozzle 332, component holding head 302 moves above component receiving member 392 as a target position, and the suction nozzle 332 is pivoted and rotated. Further, component holding head moving device 300 for moving component holding head 302, nozzle pivoting device 334 for pivoting suction nozzle 332, and nozzle rotating device 335 for rotating suction nozzle 332 start operating at the same timing. Further, since the rotation direction by nozzle rotating device 335 is a direction in which the rotation angle from the holding angle to the target angle decreases as described above, the rotation direction is a clockwise direction in the case shown in FIG. 12.

However, side wall 470 is in working area 472 of the leaded component 410 held by the suction nozzle 332. Therefore, if the nozzle pivoting device 334, nozzle rotating device 335, and the like are operated according to the above-described method, there is a worry that the leaded component 410 held by suction nozzle 332 will contact side wall 470. Note that, the determination as to whether the leaded component 410 held by suction nozzle 332 will come into contact with side wall 470 is performed based on the position and dimensions of the leaded component 410 to be held, the length dimension of holder 340, the movement path of component holding head 302, the performance of component holding head moving device 300 and component holding head 302, and the like. The performance of component holding head moving device 300 is the performance of electromagnetic motors 319, 321, and 323, and the speed and acceleration at the time of moving component holding head 302. Also, the performance of component holding head 302 is the performance of nozzle pivoting device 334 and nozzle rotating device 335, and the speed and acceleration at the time of pivoting and rotating suction nozzle 332.

In a case where leaded component 410 held by suction nozzle 332 may come into contact with side wall 470 as described above, a method may be considered of moving component holding head 302 to a position away from side wall 470 and then performing at least one of the pivoting and rotating of the suction nozzle 332. That is, a method may be considered of starting the operation of at least one of nozzle pivoting device 334 and nozzle rotating device 335 after the timing of starting the moving of component holding head 302 by component holding head moving device 300. However, the tact time may be delayed by delaying the operation of at least one of nozzle pivoting device 334 and nozzle rotating device 335.

Further, for example, by increasing the clearance between component support member 150 on which the leaded components 410 are scattered and side wall 470, it is possible to avoid contact of a leaded component 410 held by suction nozzle 332 with side wall 470. However, if the clearance between component support member 150 and side wall 470 is increased, bulk component supply device 32 becomes larger.

Therefore, when there is a possibility that the leaded component 410 held by suction nozzle 332 will come into contact with side wall 470, the rotation direction by the nozzle rotating device 335 is made to be a direction opposite to the direction in which the rotation angle from the holding angle to the target angle decreases, and is a direction away from side wall 470. In this manner, by setting the rotation direction to the direction away from side wall 470, even if component holding head moving device 300, nozzle pivoting device 334, and nozzle rotating device 335 are operated simultaneously, it is possible to prevent the leaded component 410 contacting side wall 470. This makes it possible to prevent contact of the leaded component 410 held by suction nozzle 332 with side wall 470 while preventing a delay in tact time and an increase in the size of loose component supply device 32.

Figure 13:
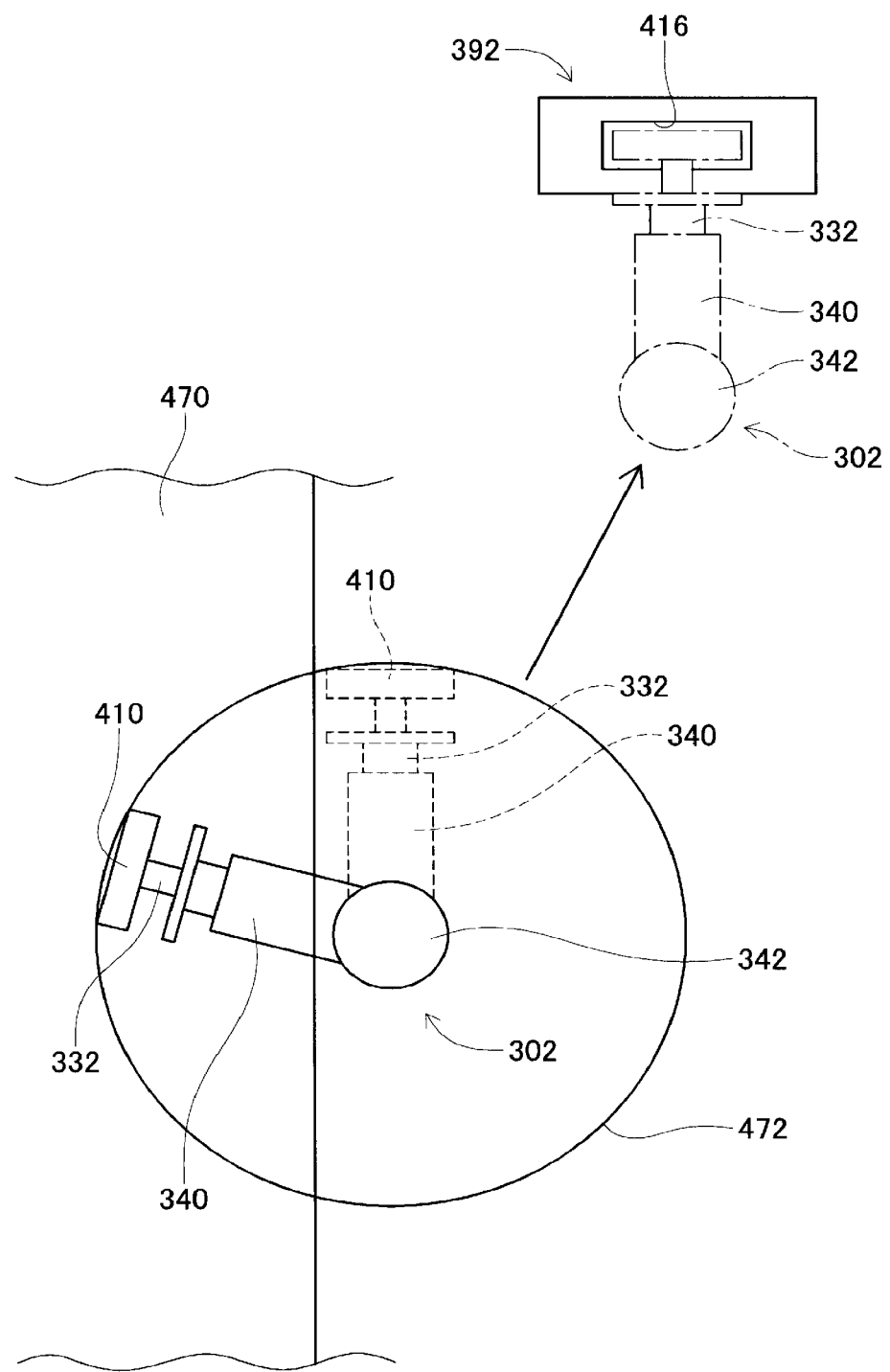
FIG. 13 is a schematic diagram showing the operating state of the component holding head when the component is liable to come into contact with the sidewall.

However, even when the rotation direction of nozzle rotating device 335 is made to be away from side wall 470, there are cases in which the leaded component 410 held by suction nozzle 332 will contact side wall 470. In detail, for example, as shown in FIG. 13, a case where leaded component 410 to be held is located at a position very close to the side wall 470 will be described. In such a case, when component holding head moving device 300, nozzle pivoting device 334, and nozzle pivoting device 335 are simultaneously operated when the rotation direction by nozzle rotating device 335 is in either the clockwise direction or the counterclockwise direction, the leaded component 410 comes into contact with side wall 470.

Therefore, in such a case, after component holding head 302 is moved to a position away from side wall 470, suction nozzle 332 is rotated. However, the rotating of holder supporting section 342 is performed simultaneously with the moving of component holding head 302. That is, component holding head moving device 300 and nozzle rotating device 335 start operating at the same timing, and nozzle pivoting device 334 starts operating after the timing of starting the operation of component holding head moving device 300 and nozzle rotating device 335.

Note that, in the case where operation of nozzle pivoting device 334 is delayed, the rotation direction by nozzle rotating device 335 is a direction in which the rotation angle from the holding time angle to the target angle decreases. Further, the timing of starting operation of nozzle pivoting device 334 is calculated based on the position and dimensions of the leaded component 410 to be held, the length dimension of holder 340, the performance of component holding head moving device 300 and component holding head 302, and the like.

Also, when leaded component 410 held by suction nozzle 332 does not come into contact with side wall 470, the rotation direction by nozzle rotating device 335 is a conventional direction, that is, a direction in which the rotation angle from the holding angle to the target angle is decreased. Then, component holding head moving device 300, nozzle pivoting device 334, and nozzle rotating device 335 start operating at the same timing.

Note that, as shown in FIG. 9, individual control device 452 has an operation control section 500. Operation control section 500 is a functional unit for controlling operation of component holding head moving device 300, nozzle pivoting device 334, and nozzle rotating device 335 by the above-described method, so as to prevent the leaded component 410 held by suction nozzle 332 contacting side wall 470.

Note that, loose component supply device 32 is an example of a work machine. Component holding head moving device 300 is an example of a moving device. Component holding head 302 is an example of a mounting head. Suction nozzle 332 is an example of a holding tool. Nozzle pivoting device 334 is an example of a pivoting device. Nozzle rotating device 335 is an example of a rotating device. Individual control device 452 is an example of a control device. Operation control section 500 is an example of an operation control section.

Further, the present disclosure is not limited to the above example embodiments, and various changed or improved methods of embodiment are possible based on the knowledge of someone skilled in the art. Specifically, for example, in an embodiment above, when leaded component 410 will contact side wall 470 regardless of the rotation direction of nozzle rotating device 335, only nozzle pivoting device 334 may be operated with a delay, but nozzle pivoting device 334 and nozzle rotating device 335 may be operated with a delay. Alternatively, only nozzle rotating device 335 may be operated with a delay. That is, the operation of at least one of nozzle pivoting device 334 and nozzle rotating device 335 may be started after the timing of starting moving of component holding head 302 by component holding head moving device 300.

Also, in an embodiment above, the present disclosure is applied to leaded components, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (work machine);
300: component holding head moving device (moving device);
302: component holding head (working head);

332: suction nozzle (holding tool);
334: nozzle pivoting device (pivoting device);
335: nozzle rotating device (rotating device);
452: individual control device (control device);
500: operation control section

The invention claimed is:

1. A work machine comprising:
a work head including a suction nozzle attached to a holder swingably held by a support shaft, the suction nozzle configured to pick up and hold a component, a rotating device including a gear set, the rotating device configured to rotate the suction nozzle about an axis of the suction nozzle, a pivoting device including an actuator which moves the holder, the pivoting device configured to pivot the suction nozzle between a first attitude in which an end portion of the suction nozzle faces downward and a second attitude in which the end portion of the suction nozzle faces sideways;
a moving device configured to move the work head, the moving device including an X-direction moving device including an X slider, a Y-direction moving device including a Y slider, and a Z-direction moving device including a Z slider; and
a control device including circuitry configured to control operation of the work head and the moving device, the control device configured to, when the work head has moved to a target position after the component has been picked up by the suction nozzle in the first attitude, cause the suction nozzle to pivot from the first attitude to the second attitude, and to cause the suction nozzle to rotate from a holding angle that is a rotation angle when the component was picked up to a target angle,
wherein the control device is configured to
determine if the component held by the suction nozzle will contact a portion of the work machine when the suction nozzle pivots from the first attitude to the second attitude and the suction nozzle rotates from the holding angle to the target angle,
when it is determined that the component held by the suction nozzle will not contact the portion of the work machine when the suction nozzle pivots from the first attitude to the second attitude and the suction nozzle rotates from the holding angle to the target angle,
operate the rotating device to rotate the suction nozzle from the holding angle to the target angle in a first direction and operate the pivoting device to pivot the suction nozzle from the first attitude to the second attitude, the rotating device and the pivoting device being operated at a same time, and
when it is determined that the component held by the suction nozzle will contact the portion of the work machine when the suction nozzle pivots from the first attitude to the second attitude and the suction nozzle rotates from the holding angle to the target angle,
operate the rotating device to rotate the suction nozzle from the holding angle to the target angle in a second direction opposite the first direction and operate the pivoting device to pivot the suction nozzle from the first attitude to the second attitude, the rotating device and the pivoting device being operated at the same time, or
operate the moving device to move the work head and operate the rotating device to rotate the suction nozzle from the holding angle to the target angle in the first direction, and operate the pivoting device to pivot the suction nozzle from the first attitude to the second attitude, the moving device and the rotating device being operated at the same time, and the pivoting device being operated after a start of operating the moving device and the rotating device.

* * * * *